(12) United States Patent
Shim et al.

(10) Patent No.: US 7,161,249 B2
(45) Date of Patent: Jan. 9, 2007

(54) MULTI-CHIP PACKAGE (MCP) WITH SPACER

(75) Inventors: Jong Bo Shim, Cheonan (KR); Han Seob Hyun, Cheonan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 27 days.

(21) Appl. No.: 10/196,299

(22) Filed: Jul. 15, 2002

(65) Prior Publication Data

US 2003/0038374 A1 Feb. 27, 2003

(30) Foreign Application Priority Data

Aug. 27, 2001 (KR) ............................ 2001-0051802

(51) Int. Cl.
*H01L 23/48* (2006.01)
*H01L 23/52* (2006.01)
*H01L 29/40* (2006.01)

(52) U.S. Cl. ...................... 257/777; 257/778; 257/723; 257/686; 257/782; 257/783; 438/108; 438/109; 438/118

(58) Field of Classification Search ................ 257/777, 257/778, 787, 678, 686, 779–784, 738, 723; 361/790, 735, 749; 438/613–615, 617, 626, 438/108, 109

See application file for complete search history.

(56) References Cited

U.S. PATENT DOCUMENTS

| | | | | |
|---|---|---|---|---|
| 5,328,079 A | * | 7/1994 | Mathew et al. | 228/180.5 |
| 5,422,435 A | * | 6/1995 | Takiar et al. | 174/52.4 |
| 5,633,535 A | * | 5/1997 | Chao et al. | 257/778 |
| 5,804,004 A | * | 9/1998 | Tuckerman et al. | 156/60 |
| 5,963,794 A | * | 10/1999 | Fogal et al. | 438/108 |
| 5,973,403 A | * | 10/1999 | Wark | 257/777 |
| 6,265,763 B1 | * | 7/2001 | Jao et al. | 257/676 |
| 6,339,254 B1 | * | 1/2002 | Venkateshwaran et al. | 257/686 |
| 6,365,963 B1 | * | 4/2002 | Shimada | 257/686 |
| 6,486,562 B1 | * | 11/2002 | Kato | 257/778 |
| 6,564,449 B1 | * | 5/2003 | Tsai et al. | 29/830 |
| 6,627,983 B1 | * | 9/2003 | Tu et al. | 257/680 |
| 2001/0015684 A1 | * | 8/2001 | Kim et al. | 333/238 |
| 2001/0036711 A1 | * | 11/2001 | Urushima | 438/460 |
| 2002/0175401 A1 | * | 11/2002 | Huang et al. | 257/686 |
| 2002/0180057 A1 | * | 12/2002 | Lee et al. | 257/777 |

* cited by examiner

*Primary Examiner*—Zandra V. Smith
*Assistant Examiner*—Thanh Y. Tran
(74) *Attorney, Agent, or Firm*—Harness, Dickey & Pierce, P.L.C.

(57) ABSTRACT

A multi-chip package includes a substrate having first bonding pads and second bonding pads, a first chip having chip pads on an active surface, spacers attached to the substrate between the first bonding pads and the second bonding pads and having a greater thickness than that of the first chip, a second chip having chip pads on an active surface, first bonding wires, second bonding wires, external connection terminals positioned on the bottom surface of the substrate, and a package body. The first chip and the second chip are any pad types. The first and second chips may have chip pads on four edges of the active surfaces or on two opposite edges of the active surfaces. The first bonding wires and the second bonding wires are bonded to the corresponding chip pads and the corresponding first and second bonding pads by the reverse bonding method. The spacer is made of one elected from the group consisting of metal, elastomer, epoxy, and photo sensitive resist. The spacer may be discontinuously formed about a perimeter of the first chip. The multi-chip package of the present invention may further comprise a third chip mounted on the second chip.

31 Claims, 6 Drawing Sheets

US 7,161,249 B2

MULTI-CHIP PACKAGE (MCP) WITH SPACER

BACKGROUND OF THE INVENTION

The present invention relates to a semiconductor packaging technology, and more particularly to a multi-chip package (MCP) with a spacer.

It has long been desired to provide low-cost semiconductor chip packages that are lighter, smaller, with higher speed, multi-function, and improved reliability. In order to satisfy this goal, a multi-chip packaging technique has been developed. The multi-chip package comprises identical or various types of plural chips being assembled into one single unit package. Compared to using plural packages, where each package comprises only a single chip, the multi-chip package has the advantages of miniaturization, low weight and high mounting density.

These multi-chip packages are classified into two types, i.e., a vertical-stacking type and a parallel-aligning type. The former reduces mounting area, while the latter simplifies the manufacturing process and reduces package thickness. In order to achieve miniaturization and low weight, the vertical-stacking type has been more commonly used in multi-chip packages. One conventional vertical-stacking type of the multi-chip package is described below.

FIG. 1 is a cross-sectional view of a conventional multi-chip package 510. The multi-chip package 510 comprises a first chip 511 mounted on a substrate 520 and a second chip 513 mounted on the first chip 511. The active surfaces of the first and second chips 511 and 513, respectively, face upward. The back surfaces of the first and second chips 511 and 513, respectively, are mounted on the substrate 520, and the first chip 511, respectively. Chip pads 512 of the first chip 511 are electrically connected to bonding pads 521 by bonding wires 535 and chip pads 514 of the second chip 513 are electrically connected to bonding pads 523 by bonding wires 537. The first chip 511, the second chip 513, and the other electrical connection elements on the substrate 520 are encapsulated with an encapsulant such as an epoxy molding resin, thereby forming a package body 541. Solder balls 543 are attached to the bottom surface of the substrate 520 and serve as external connection terminals.

The conventional multi-chip package comprises plural semiconductor chips, thereby achieving higher electrical performance and higher integration at a low-cost. Further, the area-arrayed external connection terminals of the multi-chip package satisfy the trend of ever-increasing numbers of input/output pins.

However, in the conventional multi-chip package structure, there are limits to the type and size of the chips. That is, it is difficult to stack the upper chip in an edge pad type on the lower chip in a center pad type. Also, it is difficult to stack plural center pad type chips.

Further, since the chip requires a bonding area on its surface for wire-bonding, as chips are stacked upward, the size of the upper chip should be reduced to provide the necessary bonding area. If the upper chip is bigger in size than the lower chip, the chip pads of the lower chip may be covered by the upper chip, thereby preventing wire-bonding between the chip pads of the lower chip and the bonding pads of the substrate.

Moreover, with the conventional multi-chip package structure, it is difficult to effectively control the length of the wire loop of the bonding wires.

SUMMARY OF THE INVENTION

For these reasons, it is desirable to provide a multi-chip package comprising plural chips of various types and sizes, and to provide for chips of varying sizes to be mounted above each other.

Accordingly, one embodiment of the present invention provides a multi-chip package including a substrate, a spacer and a first chip attached to the substrate surface, and a second chip mounted on the spacer.

In another embodiment of the present invention, multiple spacers are mounted on the substrate surface. In this embodiment, the plurality of spacers are formed on two opposite edges of the first chip. Alternatively, the plurality of spacers are formed along all four edges of the first chip.

In yet another embodiment of the present invention, a third chip is mounted on the second chip.

The benefits of these and other embodiments, which are described below, include providing for a more flexible approach to vertical-stacking type chip packages, decreasing the height of the wire loop used to connect the chip pads to the bond pads on the substrate surface, maximizing the stability of the loops of the bonding wires by decreasing the height of the wire loop, determining a maximum height of the wire loop of the first chip with the spacers, and reducing the total height of the multi-chip package.

BRIEF DESCRIPTION OF THE DRAWINGS

These and other features and advantages of the present invention will be readily understood with reference to the following detailed description thereof provided in conjunction with the accompanying drawings, wherein like reference numerals designate like structural elements, and, in which.

DETAILED DESCRIPTION

Embodiments of the present invention will be described below with reference to the accompanying drawings.

Figure 1:
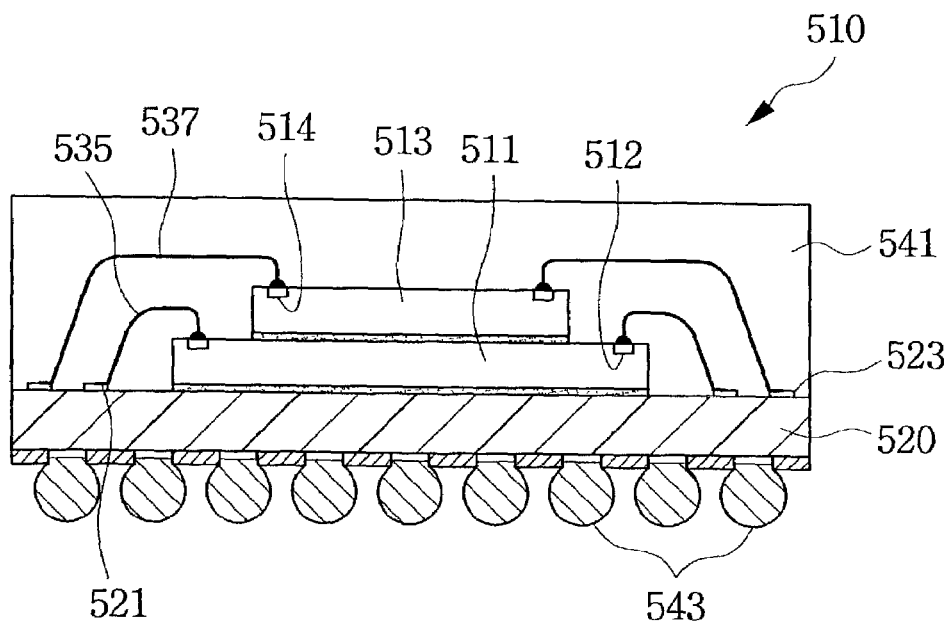
FIG. 1 is a cross-sectional view of a conventional multi-chip package.
Figure 2:
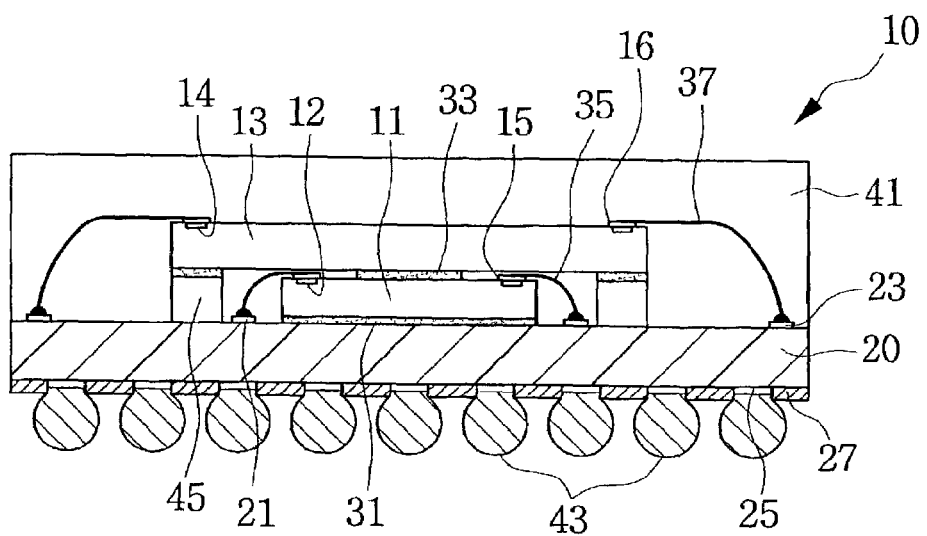
FIG. 2 is a cross-sectional view of a multi-chip package in accordance with a first embodiment of the present invention.

FIG. 2 is a cross-sectional view of a multi-chip package 10 in accordance with a first embodiment of the present invention. The multi-chip package 10 comprises a first chip 11 mounted on a substrate 20, spacers 45 attached to the substrate 20 on the peripheral area of the first chip 11, and a second chip 13 mounted on the first chip 11 and the spacers 45. Herein, the second chip 13 has a bigger size than the first chip 11. The first chip 11 and the second chip 13 are edge pad types. The first chip 11 comprises chip pads 12 on four edges of the active surface and the second chip 13 comprises second chip pads 14 on two opposite edges of the active surface. The active surfaces of the first and second chips 11 and 13 face upward. The back surface of the first chip 11 is attached to the substrate 20 by an insulating adhesive 31, and the back surface of the second chip 13 is attached to the first chip 11 and the spacers 45 by an insulating adhesive 33.

First bonding pads 21 are formed on the substrate 20 at four outer edges adjacent the first chip 11. Second bonding pads 23 are formed on the substrate 20 at two opposite outer edges from the second chip 13. Ball land patterns 25 are formed on the bottom surface of the substrate 20. The first bonding pads 21 and the second bonding pads 23 are electrically connected to the ball land pads 25 by circuit patterns (not shown) or via holes (not shown) within the substrate 20.

The spacers 45 are formed on or attached to the substrate 20 between the first bonding pads 21 and the second bonding pads 23. The spacer 45 may be made of metal, epoxy resin, photo sensitive resist (PSR), or elastomer and has a greater thickness than that of the first chip 11. For example, when using copper (Cu) to make the spacer 45, the spacer 45 may be formed by etching a Cu metal plate attached to the substrate 20 or by directly attaching a Cu spacer in a predetermined shape to the substrate 20.

The first chip 11 is electrically connected to the substrate 20 by bonding gold (Au) bumps 15 on the chip pads 12 of the first chip 11 to the corresponding first bonding pads 21 with first bonding wires 35. The second chip 13 is electrically connected to the substrate 20 by bonding gold (Au) bumps 16 on the second chip pads 14 of the second chip 13 to the corresponding second bonding pads 23 with second bonding wires 37. The first bonding wires 35 are formed below the second chip 13, and the maximum height of the wire loop of the first bonding wires 35 is determined by the height of spacers 45.

Herein, the reverse bonding method is used, that is, the first or second bonding wires 35 or 37, respectively, are bonded to the first or second bonding pads 21 or 23, respectively, by the ball bonding, and bonded to the gold bumps 15 or 16, respectively, of the chip pads 12 or 14, respectively by stitch bonding. Therefore, the height of the wire loop of the first and second bonding wires 35 and 37, respectively, is reduced, thereby minimizing the height of the space between the first chip 11 and the second chip 13, and minimizing the thickness of the spacer 45. Moreover, the reverse bonding method also reduces the total thickness of the package.

The first chip 11, the second chip 13, the first and second bonding wires 35 and 37, respectively, and the spacers 45 on the substrate 20 are encapsulated with an encapsulant such as an epoxy molding resin, thereby forming a package body 41. Solder balls 43 are formed on the corresponding ball land pads 25 and serve as external connection terminals. A solder resist 27 is provided under substrate 20 and next to ball land pads 25.

In the first embodiment of the present invention, the first chip 11 has a much smaller size than that of the second chip 13. The maximum height of wire loop of the first bonding wires 35 is determined by the height of spacers 45. In the multi-chip package 10, the first bonding pads 21 are formed on the substrate 20 within the perimeter of the second chip 13 and more closely to the first chip 11, thereby reducing the length of wire loop of the first bonding wire 35, and the total width of the package. A manufacturing process of the multi-chip package 10 is described below.

FIGS. 3a and 3b and FIGS. 4a and 4b illustrate a manufacturing process of the multi-chip package 10.

Figure 3A:
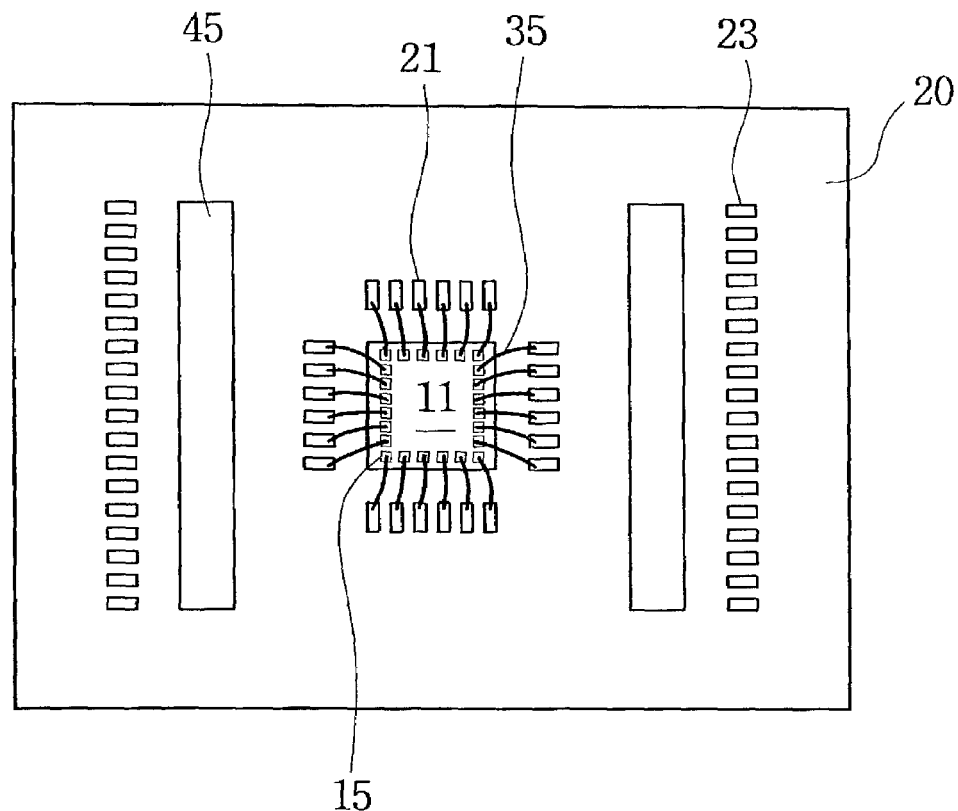
FIGS. 3a and 3b and FIGS. 4a and 4b illustrate a manufacturing process of the multi-chip package of FIG. 2.
Figure 3B:
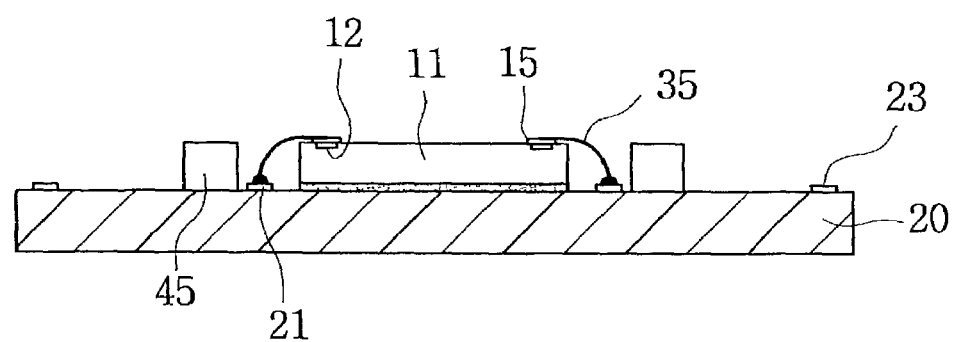

As shown in FIGS. 3a and 3b, the first chip 11, in which the gold (Au) bumps 15 are formed on the chip pads 12, is mounted on the substrate 20. The spacers 45 are already attached to the substrate 20. The first chip 11 is attached to the substrate 20 by the insulating adhesive 31 such as an Ag epoxy and cured. Then, the first chip 11 is electrically connected to the substrate 20 by bonding the gold bumps 15 to the corresponding first bonding pads 21 with the first bonding wires 35 using the reverse bonding method.

Figure 4A:
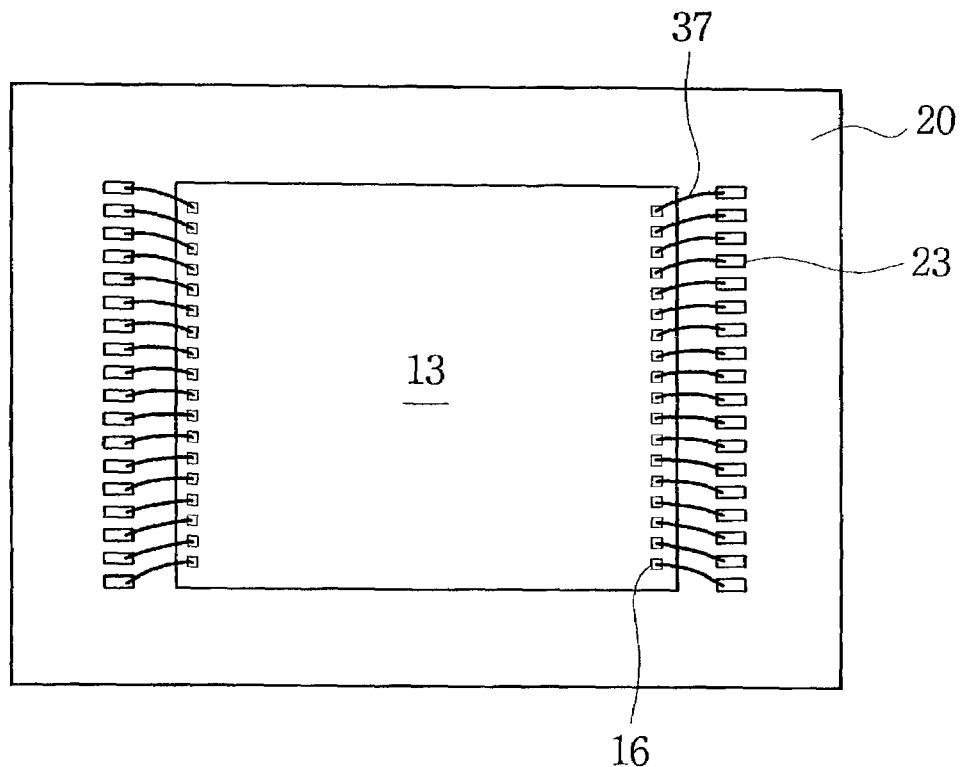
Figure 4B:
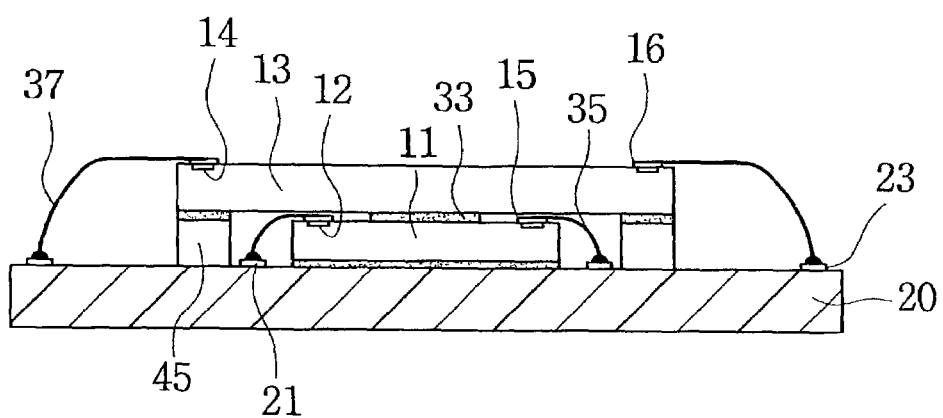

As shown in FIGS. 4a and 4b, the second chip 13 is mounted on the first chip 11 and the spacers 45. After coating the insulating adhesive 33 on the active surface of the first chip 11 and the spacer 45 by the dotting or dispensing method, the second chip 13, on which the gold (Au) bumps 16 are formed on the second chip pads 14, is attached to the first chip 11 and the spacers 45, and cured. Also, the second chip 13 is electrically connected to the substrate 20 by bonding the gold bumps 16 to the corresponding second bonding pads 23 with the second bonding wires 37 by using the reverse bonding method. The first chip 11, the second chip 13, the first and second bonding wires 35 and 37, respectively, and the spacers 45 are encapsulated by the epoxy molding resin, thereby forming the package body as shown in FIG. 2.

The multi-chip package of the present invention may comprise various types of chips and other modifications of the spacers and several embodiments of the multi-chip package are described below.

Figure 5A:
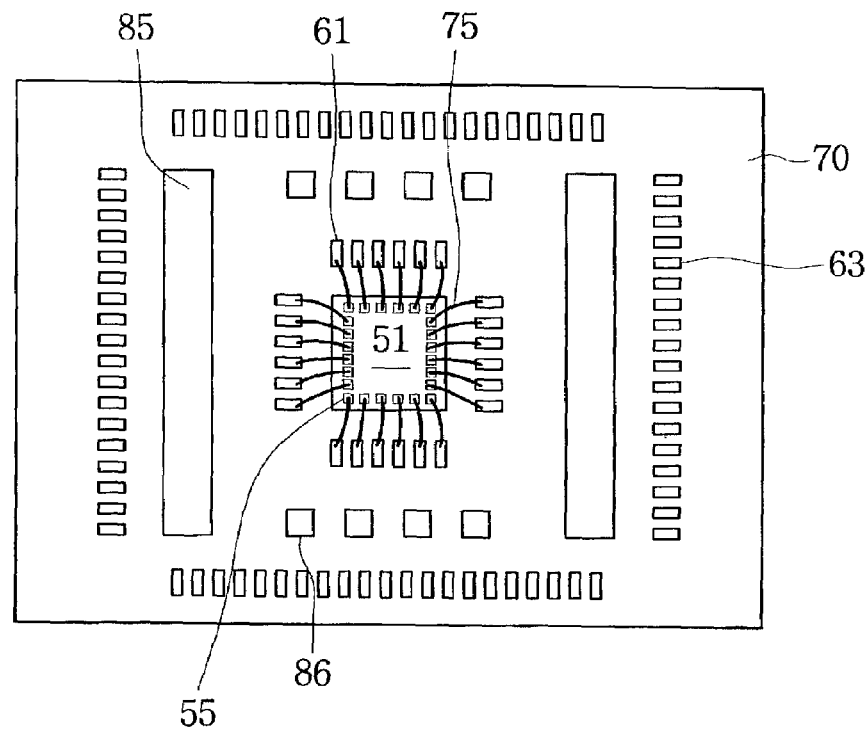
FIGS. 5a and 5b illustrate a manufacturing process of a multi-chip package in accordance with a second embodiment of the present invention.
Figure 5B:
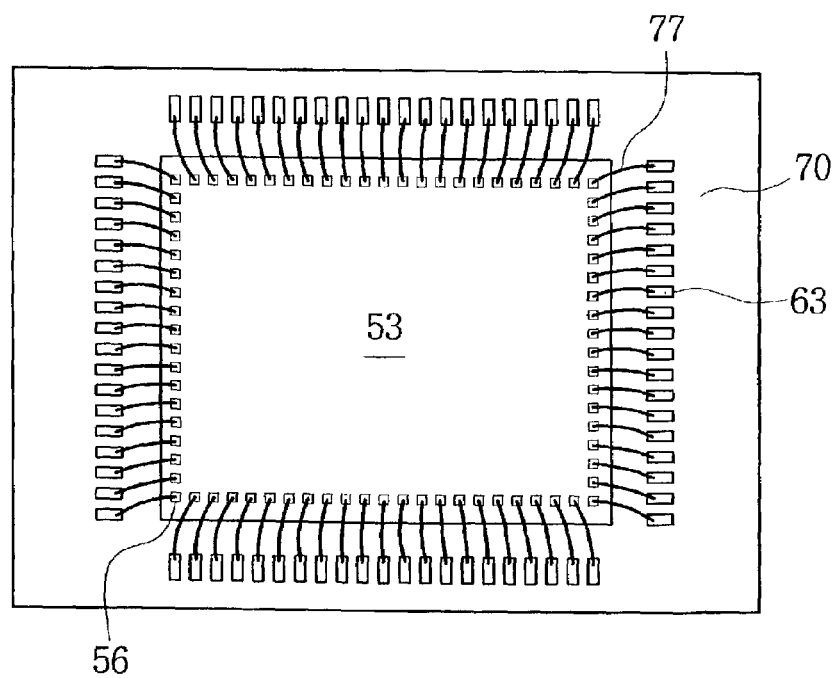

FIGS. 5a and 5b illustrate a manufacturing process of a multi-chip package in accordance with a second embodiment of the present invention. As shown in FIGS. 5a and 5b, a first chip 51 comprises chip pads (not shown) on four edges of the active surface and a second chip 53 comprises chip pads (not shown) on four edges of the active surface. Gold bumps 55 and 56 are formed on the corresponding chip pads. As illustrated in FIG. 5a, bonding wires 75 connect gold bumps 55 to first bonding pads 61. Similarly as shown in FIG. 5b bond wires 77 are used to connect gold bumps 56 to second bonding pads 63. First spacers 85 and second spacers 86 are formed on a substrate 70 between first bonding pads 61 and second bonding pads 63. The first spacers 85, which are similar to the spacer 45 of the first embodiment, are formed on two opposite edges, and the second spacers 86 are discontinuously formed on the other opposite edges.

Figure 6:
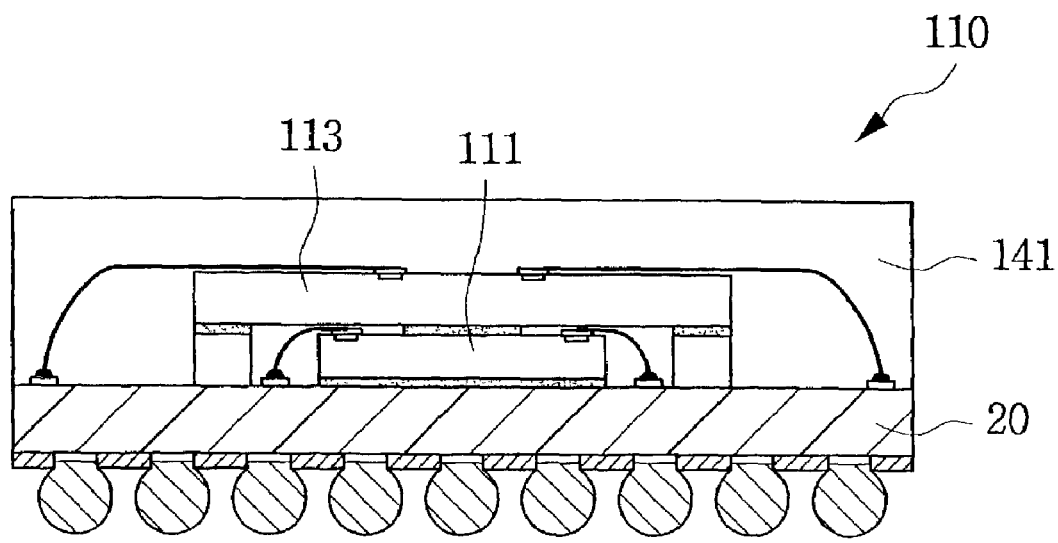
FIG. 6 is a cross-sectional view of a multi-chip package in accordance with a third embodiment of the present invention.
Figure 7:
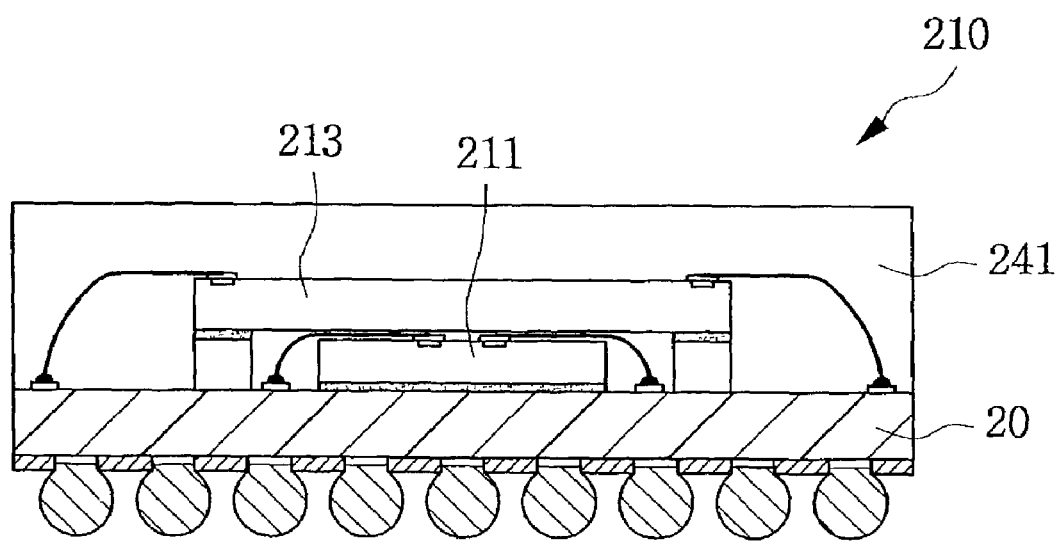
FIG. 7 is a cross-sectional view of a multi-chip package in accordance with a fourth embodiment of the present invention.
Figure 8:
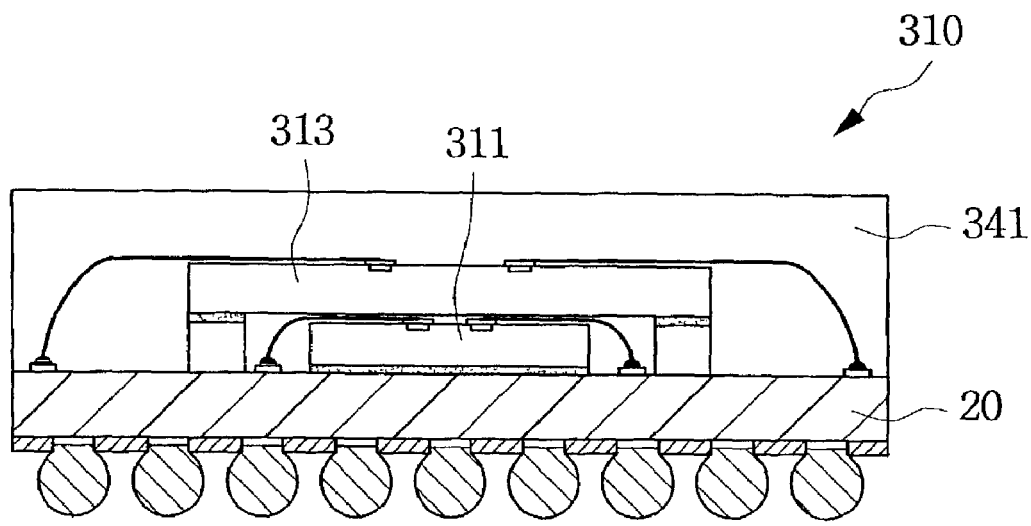
FIG. 8 is a cross-sectional view of a multi-chip package in accordance with a fifth embodiment of the present invention.
Figure 9:
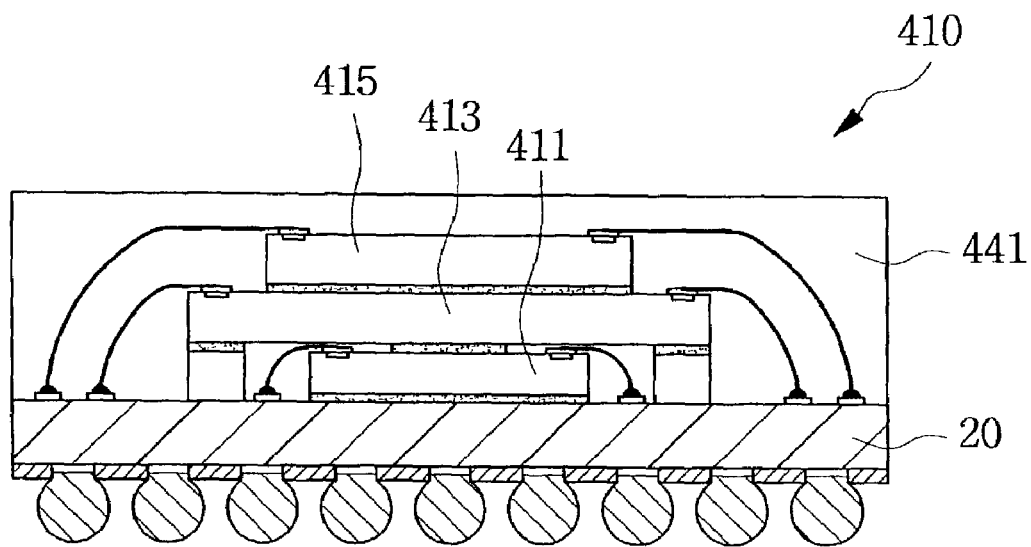
FIG. 9 is a cross-sectional view of a multi-chip package in accordance with a sixth embodiment of the present invention.

The multi-chip package of the present invention may employ both edge and center pad types of chips. FIGS. 6 through 9 show various multi-chip packages in accordance with other embodiments of the present invention. Turning now to FIG. 6, a multi-chip package 110 comprises a first chip 111 in an edge pad type and a second chip 113 in a center pad type. A multi-chip package 210 of FIG. 7 comprises a first chip 211 in a center pad type and a second chip 213 in an edge pad type, and a multi-chip package 310 of FIG. 8 comprises a first chip 311 in a center pad type and a second chip 313 in a center pad type. The present invention may also be used to package more than two chips, for example, a multi-chip package 410 of FIG. 9 comprises, three (3) chips, i.e., a first, second and third chip 411, 413 and 415, respectively. In the case where more than two chips are packaged, it is preferable to use every chip in an edge pad type.

In accordance with the present invention, the multi-chip package comprises plural chips, each having various sizes. Since the maximum height of wire loop of the bonding wires of the lowermost chip, that is, the first chip, is determined by the height of the spacers, the multi-chip package of the present invention may comprise the center and/or edge bond pad types of chips. Also, the chip pads may be formed on four and/or two edges of the active surface of any of the chips. Particularly, in the case where the first and second chips are all edge pad types, the multi-chip package of the present invention maximizes the stability of the loop of the bonding wire since the height of the wire loop is reduced, and reduces the total height of the package.

Further, by achieving the wire bonding of the lower first chip within the perimeter of the upper second chip, the length of the bonding wire is reduced, thereby reducing the total width of the package. Moreover, the reverse bonding method minimizes the thickness of the spacer, thereby reducing the total thickness of the package.

In the drawings and specification, there have been disclosed typical other embodiments of this invention and although specific terms are employed, they are used in a generic and descriptive sense only and not for purpose of limitation, the scope of this invention being set forth in the following claims.

What is claimed is:

1. A multi-chip package, comprising:
   a substrate having a surface;
   a spacer attached to and touching the surface;
   a first chip mounted on the surface;
   a second chip mounted on the spacer, such that an active surface of the first chip and an active surface of the second chip face in the same direction; and
   at least one bonding wire ball bonded to the substrate and stitch bonded to one of the first chip and the second chip,
   wherein the second chip is attached to insulating adhesives formed on the spacer and on only a portion of the active surface of the first chip, respectively.

2. The multi-chip package of claim 1, wherein:
   the first chip includes first chip pads on the active surface of the first chip;
   the second chip includes second chip pads on the active surface of the second chip;
   a back surface of the first chip is mounted on the surface;
   a back surface of the second chip is mounted on the spacer; and
   the spacer has a thickness greater than a thickness of the first chip.

3. The multi-chip package of claim 2, further comprising:
   first bonding pads formed on the surface;
   second bonding pads formed on the surface;
   first bonding wires electrically connecting the first chip pads to the first bonding pads;
   second bonding wires electrically connecting the second chip pads to the second bonding pads;
   external connection terminals positioned on a bottom surface of the substrate; and
   a package body formed by encapsulating the first chip, the second chip, the first bonding wires, the second bonding wires, and the spacer.

4. The multi-chip package of claim 3, wherein the second bonding wires are electrically connected to the second chip pads and the second bonding pads by a reverse bonding method.

5. The multi-chip package of claim 3, wherein the first bonding wires are electrically connected to the first chip pads and the first bonding pads by a reverse bonding method.

6. The multi-chip package of claim 2, wherein:
   the first chip pads are positioned on a pair of opposite edges of the active surface of the first chip; and
   the second chip pads are positioned on a pair of opposite edges of the active surface of the second chip.

7. The multi-chip package of claim 2, wherein:
   the first chip pads are positioned on four edges of the active surface of the first chip, and
   the second chip pads are positioned on four edges of the active surface of the second chip.

8. The multi-chip package of claim 1, wherein the spacer is made of a material selected from the group consisting of metal, elastomer, epoxy, and photo sensitive resist.

9. The multi-chip package of claim 1, wherein the second chip is mounted on the first chip and the spacer.

10. The multi-chip package of claim 1, further comprising a plurality of spacers attached to the surface.

11. The multi-chip package of claim 10, wherein the spacers are on a discontinuous perimeter about the first chip.

12. The multi-chip package of claim 1, wherein:
    one of the first chip and the second chip is an edge pad type; and
    the other of the first chip and the second chip is a center pad type.

13. The multi-chip package of claim 1 wherein both the first chip and the second chip are of a same pad type.

14. The multi-chip package of claim 1, further comprising a third chip mounted on the second chip.

15. The method of claim 1, further comprising a plurality of spacer having at least two different sizes.

16. A method of making a multi-chip package, comprising:
    providing a spacer on a substrate surface so that the spacer touches the substrate surface;
    mounting a first chip on the substrate surface, wherein the first chip includes an active surface on which first chip pads are provided;
    mounting a second chip on the spacer, wherein the second chip includes an active surface on which second chip pads are provided, the mounting of the second chip such that the active surface of the first chip and the active surface of the second chip face in the same direction; and
    ball bonding a bonding wire to the substrate and stitch bonding the bonding wire to one of the first chip and the second chip,
    wherein the second chip is attached to insulating adhesives formed on the spacer and on only a portion of the active surface of the first chip, respectively.

17. The method of claim 16, wherein the second chip is mounted above the first chip.

18. The method of claim 16, further comprising:
    forming first bonding pads on the substrate surface;
    electrically connecting the first chip to the substrate by bonding the first bonding pads to the first chips pads with first bonding wires;
    forming second bonding pads on the substrate surface;
    electrically connecting the second chip to the substrate by bonding the second bonding pads to the second chip pads with second bonding wires; and
    forming a package body by encapsulating the first chip, the second chip, the first bonding wires, the second bonding wires and the spacer.

19. The method of claim 18, wherein:
reverse bonding is used to electrically connect the first chip; and
reverse bonding is used to electrically connect the second chip.

20. The method of claim 16, wherein:
one of the first chip and the second chip is an edge pad type; and
the other of the first chip and the second chip is a center pad type.

21. The method of claim 16, wherein both the first chip and the second chip are of a same pad type.

22. The method of claim 16, wherein providing a spacer comprises etching a spacer on the substrate surface.

23. The method of claim 16, wherein providing a spacer comprises attaching a spacer having a predetermined shape to the substrate surface.

24. The method of claim 16, wherein the spacer is made of a material selected from the group consisting of metal, elastomer, epoxy, and photo sensitive resist.

25. The method of claim 16, further comprising mounting an additional spacer on the substrate surface.

26. The method of claim 16, wherein mounting the second chip further comprises mounting the second chip on the first chip.

27. The method of claim 16, wherein the spacer is provided on a discontinuous perimeter about the first chip.

28. The method of claim 16, wherein mounting the first chip comprises mounting a back surface of the first chip to the substrate surface.

29. The method of claim 16, wherein mounting the second chip comprises mounting a back surface of the second chip on the spacer.

30. The method of claim 16, further comprising mounting a third chip on the second chip.

31. The method of claim 16, further comprising a plurality of spacer having at least two different sizes.

* * * * *